US011782864B2

(12) United States Patent
Blate et al.

(10) Patent No.: US 11,782,864 B2
(45) Date of Patent: Oct. 10, 2023

(54) RECONFIGURABLE INTERCONNECTION NODE

(71) Applicant: AURA Technologies, LLC, Carrboro, NC (US)

(72) Inventors: Alex Blate, Chapel Hill, NC (US); Eric Strong, Morrisville, NC (US)

(73) Assignee: AURA Technologies, LLC, Carrboro, NC (US)

( * ) Notice: Subject to any disclaimer, the term of this patent is extended or adjusted under 35 U.S.C. 154(b) by 0 days.

(21) Appl. No.: 18/071,757

(22) Filed: Nov. 30, 2022

(65) Prior Publication Data

US 2023/0176991 A1 Jun. 8, 2023

Related U.S. Application Data

(63) Continuation of application No. PCT/US2021/038906, filed on Jun. 24, 2021.

(60) Provisional application No. 63/043,967, filed on Jun. 25, 2020.

(51) Int. Cl.
*G06F 13/40* (2006.01)

(52) U.S. Cl.
CPC ...... *G06F 13/4068* (2013.01); *G06F 13/4004* (2013.01)

(58) Field of Classification Search
CPC ............. G06F 13/4004; G06F 13/4068; G06F 13/4022; G06F 13/409; G06F 13/4081; G06F 1/185; G06F 2213/0026
See application file for complete search history.

(56) References Cited

U.S. PATENT DOCUMENTS

| 5,671,335 A | 9/1997 | Collins |
| 5,822,195 A | 10/1998 | Brench |
| 8,864,496 B2 | 10/2014 | Moran |
| 11,212,002 B1* | 12/2021 | Lougheed ............ H04B 10/524 |
| 2005/0258915 A1 | 11/2005 | Coleman |
| 2006/0020774 A1 | 1/2006 | Ramos |
| 2006/0227794 A1 | 10/2006 | Shivnan |
| 2007/0159788 A1 | 7/2007 | Halliday |
| 2014/0365698 A1 | 12/2014 | Richard et al. |
| 2023/0175826 A1* | 6/2023 | Hild ........................ F42C 17/04 89/6 |

OTHER PUBLICATIONS

International Search Report for PCT/US2021/038906, dated Nov. 23, 2021, 4 pages.
Written Opinion for PCT/US2021/038906, dated Nov. 23, 2021, 7 pages.
Department of Defense, "Reconfigurable Computer Architecture for Flexible Input/Output (I/O)," DoD 2020.1 SBIR Solicitation (/node/1654283). Dec. 10, 2019.

* cited by examiner

*Primary Examiner* — Brian T Misiura
(74) *Attorney, Agent, or Firm* — Danielson Legal LLC (57) ABSTRACT

Reconfigurable interconnection nodes and interface modules are provided. The reconfigurable interconnection node includes a circuit board with a processing unit executing instructions stored on memory to provide operating system software, at least one bus, and at least one bus connector. The reprogrammable interconnection node also includes at least one system interface module operably connected to the circuit board via the at least one bus, wherein the system interface module is configured to communicate with or exchange data with at least a first external system.

21 Claims, 3 Drawing Sheets

RECONFIGURABLE INTERCONNECTION NODE

CROSS REFERENCE TO RELATED APPLICATIONS

The present application is a continuation of International (PCT) Patent Application No. PCT/US2021/038906, filed internationally on Jun. 24, 2021, and claims the benefit of and priority to United States Provisional Appl. No. 63/043,967, filed on Jun. 25, 2020, the entire disclosure of each of which is hereby incorporated by reference as if set forth in their entirety herein.

TECHNICAL FIELD

Embodiments described herein relate to input/output devices and, more particularly but not exclusively, to reconfigurable interconnection computing platforms.

BACKGROUND

Computing platforms and associated systems often suffer from obsolescence, limited manufacturing sources, or materials shortages. Similarly, a system may fail to comply with changing regulations, become cost-prohibitive, or require components that are in limited supply. Systems or devices thereof may need to be replaced, reconfigured, upgraded, or otherwise changed.

A computing platform may also have several sub-systems or sensors that do not easily communicate with each other. This makes it difficult to synthesize data from different sensors and share data with others. For example, different sub-systems may be manufactured by different manufacturers or operate in accordance with different protocols.

It is also difficult to anticipate systems that will be developed in the future and how those systems will be configured. Manufacturers therefore do not know how their products should be designed now so they can integrate with other systems in the future.

A need therefore exists for reprogrammable or reconfigurable computing platforms that address the above difficulties associated with existing computing platforms.

SUMMARY

This summary is provided to introduce a selection of concepts in a simplified form that are further described below in the Detailed Description section. This summary is not intended to identify or exclude key features or essential features of the claimed subject matter, nor is it intended to be used as an aid in determining the scope of the claimed subject matter.

According to one aspect, embodiments relate to a reconfigurable interconnection node. The node includes a circuit board including a processing unit executing instructions stored on memory to provide operating system software, at least one bus, and at least one bus connector; and at least one system interface module operably connected to the circuit board via the at least one bus, wherein the system interface module is configured to communicate with or exchange data with at least a first external system.

In some embodiments, the interconnection node includes a plurality of system interface modules, and each of the plurality of system interface modules communicate with each other via the at least one bus.

In some embodiments, the node further includes firmware associated with the at least one system interface module.

In some embodiments, the at least one system interface module further includes a processor card programmed with one or more firmwares, and at least one mezzanine module to connect the system interface module with at least the first external system. In some embodiments, the processor card includes one or more reconfigurable hardware devices. In some embodiments, the at least one mezzanine module includes one or more external electrical interfaces or optical interfaces.

In some embodiments, the processor card is programmed to receive data from a first interface of the at least one mezzanine module regarding the first external system, process the received data regarding the first external network, and transmit the processed data to a second interface of the system mezzanine module. In some embodiments, the first interface is distinct from the second interface.

In some embodiments, the at least one mezzanine module communicates with the first external system via a first interface specification, and communicates with a second external system via a second interface specification. In some embodiments, the operating system software reconfigures the system interface module so that the at least one mezzanine module can communicate with or exchange data with a second external system. In some embodiments, the reconfiguration involves changes to only firmware associated with the system interface module. In some embodiments, the at least one mezzanine module is associated with at least one IP block in the firmware of the processor card.

In some embodiments, the at least one mezzanine module includes digital interface circuitry including one or more of buffers, logic-level converters, digital voltage converters, single-ended-to-differential converters, repeaters, digital signal conditioning circuitry, data converters, or impedance matching circuity, wherein the digital interface circuitry is reconfigurable in situ and without requiring physical hardware modification.

In some embodiments, the first external system is configured to execute one or more software modules that execute a first instruction set to provide a first capability. In some embodiments, the system interface module is configured to execute a second instruction set to implement the first capability without requiring a physical change to the system interface module.

In some embodiments, the node is configured as a turret node or a hull node. In some embodiments, the node is configured to be operably connected with a slipring to connect to the first external system.

In some embodiments, at least a first software application executes on the processing unit of the circuit board, and: receives data from at least a first system interface module, receives data from a second interface module, performs computations on the received data to generate computational results, and transmits the computational results to at least a third system interface module. In some embodiments, at least the third system interface module is a network interface. In some embodiments, the third system interface module conveys the computational results to at least a second interconnection node. In some embodiments, at least a second software application executes on a second processing unit of a second circuit board of the second interconnection node and: receives the computational results from the first interconnection node, receives data from at least one system interface module of the second interconnection node, performs local computations on the received data to generate local computational results, and transmits the local computational results to at least one second system interface module of the second interconnection node. In some embodiments, the local computational results comprise a firing solution. In some embodiments, the local computations comprise single- or multi-view image processing results.

According to another aspect, embodiments relate to an interface module. The interface module includes a processor card including one or more reconfigurable processors, one or more external bus interfaces, and one or more modular connectors; and at least one mezzanine module configured to connect with the one or more modular connectors of the processor card, wherein the at least one mezzanine module is associated with reconfigurable firmware to implement a first capability associated with a first external system and a second capability associated with a second external system.

BRIEF DESCRIPTION OF DRAWINGS

Non-limiting and non-exhaustive embodiments of this disclosure are described with reference to the following figures, wherein like reference numerals refer to like parts throughout the various views unless otherwise specified.

DETAILED DESCRIPTION

Various embodiments are described more fully below with reference to the accompanying drawings, which form a part hereof, and which show specific exemplary embodiments. However, the concepts of the present disclosure may be implemented in many different forms and should not be construed as limited to the embodiments set forth herein; rather, these embodiments are provided as part of a thorough and complete disclosure, to fully convey the scope of the concepts, techniques and implementations of the present disclosure to those skilled in the art. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Reference in the specification to "one embodiment" or to "an embodiment" means that a particular feature, structure, or characteristic described in connection with the embodiments is included in at least one example implementation or technique in accordance with the present disclosure. The appearances of the phrase "in one embodiment" in various places in the specification are not necessarily all referring to the same embodiment. The appearances of the phrase "in some embodiments" in various places in the specification are not necessarily all referring to the same embodiments.

Some portions of the description that follow are presented in terms of symbolic representations of operations on non-transient signals stored within a computer memory. These descriptions and representations are used by those skilled in the data processing arts to most effectively convey the substance of their work to others skilled in the art. Such operations typically require physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices. Portions of the present disclosure include processes and instructions that may be embodied in software, firmware or hardware, and when embodied in software, may be downloaded to reside on and be operated from different platforms used by a variety of operating systems.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each may be coupled to a computer system bus. Furthermore, the computers referred to in the specification may include a single processor or may be architectures employing multiple processor designs for increased computing capability.

The processes and displays presented herein are not inherently related to any particular computer or other apparatus. Various general-purpose systems may also be used with programs in accordance with the teachings herein, or it may prove convenient to construct more specialized apparatus to perform one or more method steps. The structure for a variety of these systems is discussed in the description below. In addition, any particular programming language that is sufficient for achieving the techniques and implementations of the present disclosure may be used. A variety of programming languages may be used to implement the present disclosure as discussed herein.

In addition, the language used in the specification has been principally selected for readability and instructional purposes and may not have been selected to delineate or circumscribe the disclosed subject matter. Accordingly, the present disclosure is intended to be illustrative, and not limiting, of the scope of the concepts discussed herein.

Acronyms Used
    API—Application programming interface
    COTS—Commercial off-the-shelf
    DMSMS—Diminishing manufacturing sources and materials shortages DSP—Digital signal processing (or digital signal processor)
FMC—FPGA mezzanine card
FPGA—Field-programmable gate array
MIL-STD—Military standard
GPU—Graphics processing unit
ISA—Instruction set architecture
IO, I/O—Input/Output
PCIe—Peripheral Component Interconnect Express
PHY—Physical interface (e.g., Ethernet)
RIOP—Reconfigurable I/O Platform
SFP—Small form-factor pluggable
SIM—System interface module
SMM—System mezzanine module
SoC—System-on-chip
SPC—System processor card As discussed previously, devices or systems often need to be replaced, reconfigured, upgraded, or otherwise changed for a variety of reasons. These devices or systems may become obsolete, fail to comply with changing regulations, become cost-prohibitive, require components that are in limited supply, etc. Accordingly, there may be need to update, change, or otherwise reconfigure systems or components thereof. In addition to assessing obsolescence and available resources, this process may involve assessing the risk(s) associated with reconfigurability.

A particular system may also include a plurality of sub-systems performing related or unrelated functions. However, these sub-systems may be produced by different manufacturers, gather different types of data, operate in accordance with different protocols, or the like. Accordingly, this makes it difficult for these sub-systems to communicate with one another or to synthesize data from multiple sub-systems. Similarly, data from multiple sub-systems may be presented to a user in ways that are not convenient for the user to view said data.

These problems are at least partially exacerbated because manufacturers may not have access to legacy systems. Similarly, manufacturers are unable to predict or otherwise account for future designs or configurations of other systems with which they will need to integrate.

It may also be difficult if not impossible to remove one system and implement a new system in its place. For example, there may be certain protocols that a new or reconfigured system must follow in order to operate as intended.

The embodiments described herein include a reconfigurable or reprogrammable interconnection node that addresses the problems associated with existing systems and architectures discussed above. The reconfigurable interconnection node may include one or more system interface modules to interface with one or more external systems, switches, or devices (for simplicity, "external system"). The system interface modules may import capabilities provided by external systems or devices, and can be reconfigured at the firmware level instead of requiring hardware replacement.

The design, configuration, and implementation of a reconfigurable input/output platform in accordance with the embodiments herein may be based on a variety of factors. One factor relates to upgrades and reconfiguration modalities. For example, the implementation of the reconfigurable interconnection node may be based on how upgrades will be applied, roll-back mechanisms, post-upgrade or reconfiguration validation considerations, how reconfigurations are applied to the node, and how upgrades are sequenced.

Another factor relates to dependencies between component firmwares. For example, the reconfigurable interconnection node may be designed to avoid or prevent dependencies between various components. In some embodiments, the standardization of physical hardware configurations may reduce the risk of dependencies.

Modifying the hardware of a system by, what is essentially a software upgrade, may open a new attack surface against the system. Accordingly, the described embodiments may also include invariant or trusted hardware modules to establish chains-of-trust for firmware.

One feature of the disclosed interconnection node is that custom hardware is not required. The disclosed embodiments may instead rely on processing cards with at least one mezzanine module. These mezzanine module(s) may be configured to interface with external systems, and change features of their implementation rather than requiring changes to hardware. To the extent that any changes are required, they can be implemented at the mezzanine layer.

It may be desirable in various applications to use certain functions on a processing device (e.g., FPGA). The embodiments herein, however, can implement these functions on a system processor card. For example, the system processor card(s) described herein may execute CODEC procedures between sources and destinations, convert videos, etc.

Figure 1:
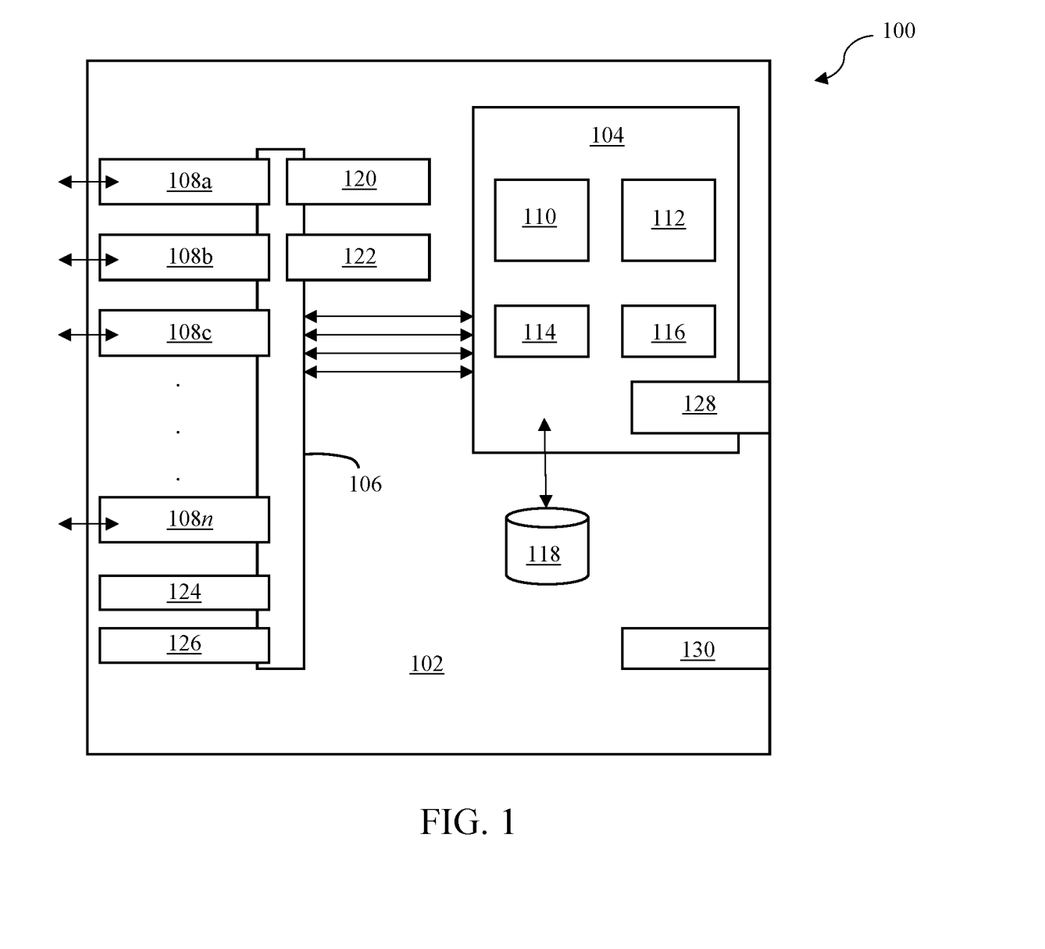
FIG. 1 illustrates a reconfigurable input/output and computing platform in accordance with one embodiment.

As used in the present application, a "RIOP node" may refer to an instance of a reconfigurable-architecture input/output and computing platform. FIG. 1 illustrates an RIOP node 100 in accordance with one embodiment. The RIOP node 100 may comprise a chassis 102 having a circuit board device 104 (e.g., a motherboard), one or more buses 106, and one or more system interface modules (for simplicity, "SIM" or "SIN/Is") 108a-n, where n is the number of SIMS that are connected to or can be connected to the bus 106.

The circuit board device 104 may include one or more processing units 110 and 112 executing instructions stored on memory 114 and 116. The memories 114 and 116 may be L1, L2, or L3 cache or RAM memory configurations. The memories 114 and 116 may include non-volatile memory such as flash memory, EPROM, EEPROM, ROM, and PROM, or volatile memory such as static or dynamic RAM, as discussed above. The exact configurations or types of memories 114 and 116 may vary as long as instructions can be executed by the circuit board device 104 to accomplish the objectives of various embodiments described herein.

The circuit board device 104 may also be in communication with one or more durable storage devices 118. The storage device(s) 118 may store instructions to be executed by the processing units 110 and 112, as well as data regarding external systems, devices, or networks. These storage device(s) 118 may include hard disks, solid-state drives, etc., as well as other types of non-volatile media or storage.

The one or more processing units 110 and 112 may execute instructions stored in memories 114 and 116 or storage 118 to implement application software that communicates with the SIM(s) 108. For example, the system software may include APIs or libraries to implement application software to communicate with the SIM(s) 108. These libraries may provide abstractions for equivalent classes of data types or device types. These types may include, but are not limited to, video streams, frequency-domain data, network packets, or the like.

The bus 106 may be configured as a PCIe backplane to provide multiple slots for one or more SIMS 108a-n. In some embodiments, there may be multiple PCIe backplanes. The number of SIMS 108 connected to the bus 106 may vary and may depend on the application and functionality required. In some embodiments, the RIOP node 100 may use a ruggedized PCIe-based card cage with robust backplane connectors, rather than card-edge connectors. In these embodiments, each SIM 108 may be enclosed in a shell device for protection. The mechanical design ultimately used may rely on a variety of form-factors and parts.

Figure 2:
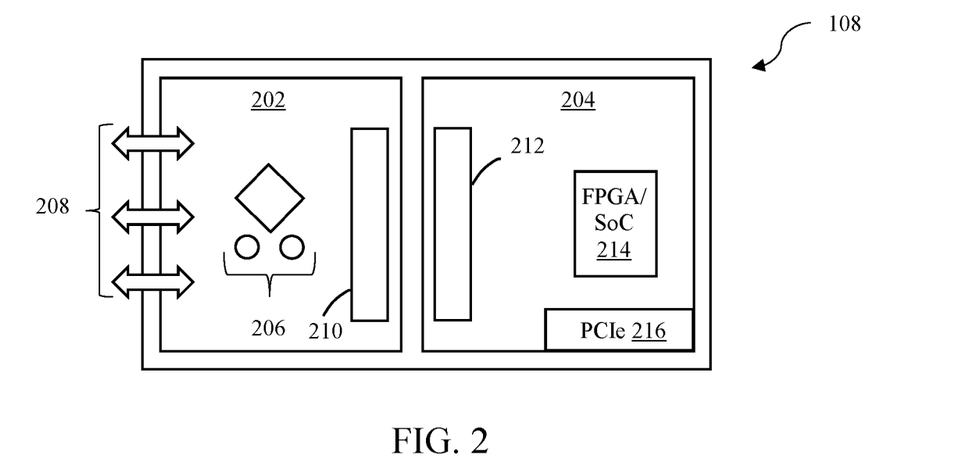
FIG. 2 illustrates the system interface module (SIM) 108 of FIG. 1 in accordance with one embodiment.

FIG. 2 illustrates a SIM 108 of FIG. 1 in accordance with one embodiment. The SIM 108 may include one or more system mezzanine modules (for simplicity, "SMM") 202 and one or more system processor cards (for simplicity, "SPC") 204. The SIM 108 and, more particularly the SMM 202, may interface between the RIOP node 100 and external devices or systems.

The SMM 202 may be substantive, custom hardware of the embodiments described herein, and may include interface-specific electronics 206 and one or more physical interfaces or connectors 208. The electronics 206 may include components for galvanic isolation and protection, logic level translation, signal conditioning, termination, data conversion (e.g., analog-to-digital or digital-to-analog), or the like. The SMM 202 may also include analog front-end circuitry, analog filters, signal conditioning circuitry, amplifiers, attenuators, or other analog-domain circuitry.

The electronics 206 may also include buffers, logic-level converters, digital voltage converters, single-ended-to-differential or differential-to-single-ended converters, repeaters, digital signal conditioning circuitry, or circuitry for digital termination, impedance matching, equalization, or the like. In some embodiments, aspects of the electronics 206 are reconfigurable or reprogrammable in situ, i.e., without physical hardware modifications.

For example, the external reference voltage for a digital voltage converter may be provided by a digital-to-analog converter, thereby allowing the voltage to be programmable. As discussed above, the SMM 202 may be configured with electrical or galvanic components such as optocouplers or inductive coupling devices between devices external to the SMM 202 and its connectors 208 to accommodate the required reconfiguration(s).

There may be instances in which a COTS device is unavailable or does not exist for an interface that is required for an application. Accordingly, the SIM 108 and, more specifically, the SMM 202 can interface with an external system or device via one or more connectors 208.

The connectors 208 may comprise a variety of different types of connection mechanisms. For example, the connectors 208 may include, but are not limited to, combinations, permutations, multiplicities or various configurations of single-ended electrical connections, differential electrical connections, single-ended or differential analog electrical connections, current loop electrical connections, fiber optic connections, small-format pluggable connections, or the like. In some embodiments a connector 208 may comprise two or more physical interfaces.

The SMM 202 may further comprise one or more programmable logic devices (e.g., FPGAs). Such embodiments further include means to program such logic devices remotely from the SPC 204. These embodiments may also include the means to upload new firmware or binary code to the SMM 202 from the SPC 204 (i.e., the SMM 202 itself may be reprogrammable).

The SMM 202 may also include one or more connectors 210 to connect with one or more connectors 212 of the SPC 204. The connectors 210 and 212 may be FMC connectors, for example. One of ordinary skill in the art will recognize that a wide variety of mezzanine connectors or connectors that can be used for this purpose exist. Accordingly, the use of one type of connector or another does not fundamentally alter the functionality or utility of the present system.

In some embodiments, one or more SPCs 204 may have multiple FMC connectors to enable multiple SMMs 202 to be installed on the same SPC 204. The SMM(s) 202 and the SPC(s) 204 may interface with fiber optic interconnects. For example, the SPC 204 may include a plurality of built-in, PHY connections such as the connectors 208 of the SMM 202. In the embodiments, the SMM 202 may not be necessary.

The SPC 204 may also include one or more reconfigurable COTS FPGA or system-on-a-chip 214 devices, as well as one or more PCIe connectors 216 or other type(s) of bus connector(s). The SPC 204 may additionally or alternatively include one or more charge-programmable logic devices (CPLDs), programmable logic devices (PLDs), digital signal processors (DSPs), GPUs, accelerator cards, tensor flow processors, application-specific integrated circuit (ASICs), microcontrollers, microprocessors, or any other type of processing device whether available now or invented hereafter.

The SPC 204 may be programmed via firmware to provide or implement processes, hardware acceleration, or related functions. These functions may include, but are not limited to cryptographic algorithms, cryptographic accelerators, audio or video CODECs, compression procedures, networking functions, routing, switching, application-specific hardware acceleration, graphics processing, signal processing, or the like.

The programmable logic of the SPC 204 may be programmed via firmware to provide one or more "soft core" embedded processors to run specified or selected software thereon. In some embodiments, an SPC 204 can be programmed such that it provides a multiplicity of independent, heterogeneous or homogenous embedded processors/microprocessors and the ability to run software on each such processor. In some embodiments, the software may comprise a real-time operating system. In some embodiments, the software of each embedded processor may be programmed individually or severally.

Each SIM 108 may serve as a modular, reconfigurable I/O interface. The SPC 204 may be programmed to convey information, typically bidirectionally, between the bus 106 of FIG. 1 and one or more external electrical interfaces of an associated SMM(s) 202.

Similarly, the SPC 204 of each SIM 108 may be configured to read and receive data from one or more of its associated SMM 202. The SPC 204 may then perform any required processing or computations on said data, and then transmit the processed data via one or more of the SMM's 202 external interfaces (i.e., the connector(s) 208). The interface(s) for receiving data and transmitting data may or may not be distinct.

In operation, a SIM 108 may be programmed to operate and connect with a first external device or system (for simplicity, "external system"). The SIM 108 may connect with the external system via a first interface specification. For example, the first interface specification may involve an electrical specification, a bus specification, a signaling standard, a protocol, or the like.

The SIM 108 may be reconfigured to operate and connect with a second external system or device via a second interface specification. For example, the second interface specification may involve an electrical specification, a bus specification, a signaling standard, a protocol, or the like. The reconfiguration of the SIM 108 to operate between the first and second interface specifications may require only firmware changes. Such reconfiguration does not involve or require changes to the physical hardware of the SIM 108a or any of its components.

In addition to managing firmware for the SIMS 108, the circuit board device 104 may manage the node's own software (e.g., operating system and user applications) and the software of potentially many other systems running on SoCs 214 and softcore CPUs on the SIMS 108. It is desirable that each system's operating software be upgradable substantially independent from its SIM's firmware (though this is not always possible in practice). Embodiments may also account for cybersecurity concerns for softcore-based software that may be applicable for the same software running on a traditional embedded system.

The authenticity and integrity of an SPC 204, SMM 202, firmware, software, firmware, etc. can be cryptographically verified. Such verification may be based on public-key cryptography or such other cryptosystems that may exist now or in the future. In some embodiments, an SPC 204 verifies the authenticity of connected SMMs 202. In some embodiments, the SPC 204 verifies the authenticity and integrity of firmware(s), software modules, firmware, etc.

As shown in FIG. 1, the SIM 108 may be connected to the circuit board device 104 via an external bus connector. In some embodiments, such as in FIG. 1, there may be multiple SIMS 108. Each SIM 108 may route or exchange data with other SIMS 108. For example, the operating software of the node 100 may provide means for a first SIM 108a to communicate directly with a second SIM 108b via the bus 106. In some embodiments, the operating software of the node 100 may receive data from a first SIM 108a, optionally perform processing on said data, and send the processed data to a second SIM 108b. In some embodiments, the bus 106 may be a PCIe backplane. The bus 106 may also be Ethernet-compatible. There may be multiple busses 106 and, in some embodiments, inter-bus communication may be may be implemented in the hardware of bus(ses) 106, in the hardware of circuit board device 104, or in the operating software of the node 100.

Before or during operation, the circuit board device 104 may obtain status reports from one or more SIMS 108. For example, and without limitation, the operating software of the node 100 may identify or enumerate the SIMS 108. Similarly the software may perform any required authentication procedures to authenticate one or more SIMS 108.

The circuit board device 104 may execute software to program or reprogram one or more SIMS 108 and their attendant hardware. For example, the circuit board device 104 may execute software to ensure compatibility and interoperability between multiple SIMS 108 and their respective firmware versions. That is, some SIMS 108 may require other SIMS 108 to execute certain versions of firmware.

Referring back to FIG. 1, the bus 106 may also interface with one or more acceleration cards 120 to accelerate various tasks. The type of acceleration card(s) used may vary but may include compression accelerator cards, AI accelerator cards, graphics accelerator cards, and cryptographic accelerator cards.

For example, a hardware acceleration capability may be implemented in a SIM 108 and made available to applications. That is, a SIM 108 may contain acceleration hardware for use by the RIOP node 100, but the acceleration hardware does not interact directly with the SIM's SMM 202. Similarly, the bus 106 may interface with one or more graphics processing units (GPUs) 122.

The bus 106 may also interface with one or more commercial interface cards 124 (for simplicity, "COTS IF") to connect with external devices, systems, or networks. For example, and without limitation, the COTS IF 124 may be configured to connect to Ethernet, external PCIe(s), radio or satellite networks, or the like.

The bus 106 may also interface with one or more proprietary communication devices or cards (for simplicity, "COMMS") 126. The COMMS 126 may enable cryptography or execute steps to ensure secure wireless network access, for example.

Applicant also notes that, and as shown in FIG. 1, the circuit board device 104 may include one or more peripheral interface cards 128 as well. These interface cards 128 may be similar to the COTS IF 124 and the COMMS 126 discussed above.

The RIOP node 100 may also include one or more power supply units 130. The power supply units may be configured to convert alternating current from a power source to an appropriate direct current for the components of the RIOP node 100. The power supply units may be configured to convert direct current from a power source into appropriate direct current for the components of node 100; one of ordinary skill in the art will recognize such a power supply as a DC-to-DC converter. The exact configuration or type of power supply unit(s) 130 used may vary as long as they can supply power to the components of the RIOP node 100 to accomplish the features of the embodiments described herein.

The embodiments described herein may improve the reconfigurability infrastructure of a system to address the disadvantages discussed above. That is, the described embodiments may reliably and robustly expose and manage the reconfiguration of a platform and provide an efficient development environment and ecosystem of the platform.

The RIOP node 100 may execute a real-time operating system. For example, the operating system may be a mixed-criticality operating system or executed via a hypervisor.

Although not shown in FIG. 1, the hardware components of the node 100 may be packaged in a chassis, case, or some other type of protective device (for simplicity, "chassis"). The chassis may be designed or certified to meet certain environmental or mechanical requirements.

Similarly, SIMS 108a-n may be designed or packaged such that an assembled node meets any applicable mechanical or environmental requirements. Additionally, and as discussed above, the SIMS 108a-n are hot-swappable and can similarly be installed, removed, or exchanged without disassembling the chassis.

The circuit board device 104 enables direct or logical communication or exchange of data between external, network-connected systems and SIM(s) 108. Similarly, the circuit board device 104 enables the conveyance of data originating from or otherwise passed through one or more SIM(s) 108.

In some embodiments, an external, network-connected system may be a second RIOP node 100. In some embodiments, application software running on the circuit board device 104 of a first RIOP node 100 may process data received from one or more SIM(s) 108 of the first RIOP node in conjunction with data received from an external, network-connected second RIOP node 100. This data may have originated from one or more SIM(s) of the second RIOP node or may be the result of computations performed by software of the second RIOP node. In some embodiments, a plurality of RIOP nodes 100 may communicate individually and severally via one or more networks. In some embodiments, a first RIOP node 100 may receive data from at least a second RIOP node 100, optionally perform processing on said data, and send the processed data to one or more SIM(s) 108 of the first node via bus 106.

The RIOP node 100 of FIG. 1 and components thereof can implement the capability of a dedicated or specialized physical system, such as the first external system discussed above. That is, the RIOP node 100 can be reconfigured to implement a capability performed by the external system.

In these scenarios, the RIOP node 100 may serve as a "destination" system, whereas a "source" system provides a capability. The source system may comprise one or more software modules that execute a first instruction set architecture (for simplicity, "ISA") and one or more external electrical or optical interfaces that can connect to one or more other systems or devices such as the SIMS 108a-n. The first ISA may specify which types of data are supported, the inputs of the architecture, the output(s) of the architecture, hardware support for managing memory, as well as other features related to memory.

The destination system may include one or more hard- or soft-core processing units implementing a second ISA, which may be the same or different architecture set as the first ISA. The destination system's hardware may be programmed to expose one or more electrical optical interfaces that are compatible with the respective interfaces of the source system. The destination system may be programmed to execute one or more software modules implementing the same or equivalent functionality as the software of the source system. This enables the destination system to provide the capability without any physical changes to other devices.

This migration of the capability to the RIOP node 100 (i.e., the destination system), may be used to mitigate the obsolescence, reliability, maintainability, hardware availability, or other factors pertaining to the destination system. For example, the hardware of a system may no longer be manufactured but new instances of a particular capability may still be required.

There may be other reasons for migrating a capability to a destination system. For example, the migration of a capability to a destination system may be to mitigate or eliminate physical space, mass, or power consumed by the source system.

Figure 3:
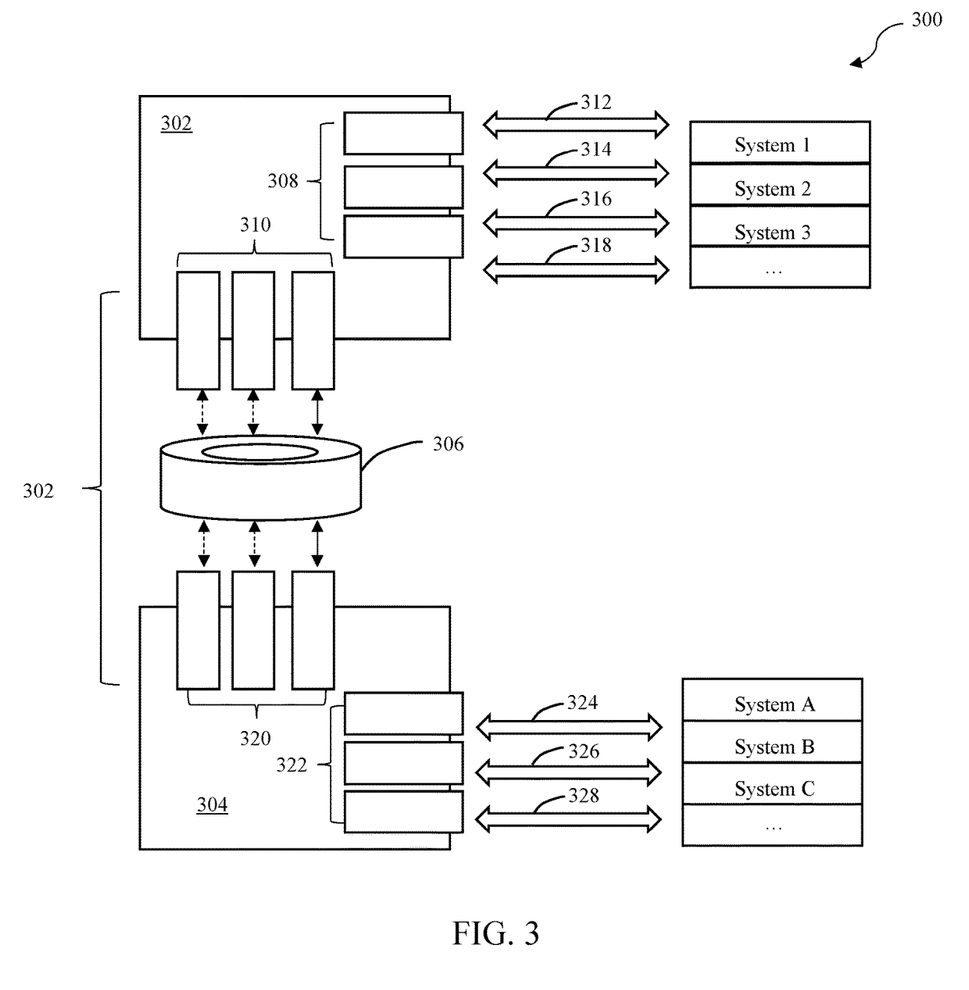
FIG. 3 illustrates a diagram of a reconfigurable input/output slipring interconnection system in accordance with one embodiment.

FIG. 3 illustrates a block diagram of an RIOP slipring interconnection system 300 in accordance with one embodiment. The interconnection system 300 may be part of a turret-hull interconnection system on a vehicle.

For example, the interconnection system 300 may include a turret node 302 and a hull node 304 that are connected by a slipring 306. As in FIG. 1, the nodes of FIG. 3 may be implemented on COTS ruggedized server hardware. A variety of form-factors may be available to meet the space, weight, and power (SWaP), I/O, and computational requirements of a variety of vehicles.

The channels of the system 300 may comprise a combination of fiber optic, differential, and single-ended links. These channels, in the aggregate, may connect systems in a vehicle's turret with those in the vehicle's hull. The slipring 306 may terminate physical connections on each side thereof and may provide interfaces for connecting the systems in turret node 302 with those in the hull node 304.

In some embodiments, the slipring 306 forms a "slipring I/O bus". A set of SIMS such as the SIM 108 of FIGS. 1 & 2 may connect to each side of the slipring 306, and vehicle-specific combinations of SIMS may be installed in the nodes 302 and 304 to connect to their respective systems.

The turret and hull nodes 302 and 304, respectively, may be similar to the RIOP node 100 of FIG. 1. These nodes 302 and 304 may facilitate initial systems integration and the mitigation of present or future obsolescence and DMSMS issues. The nodes 302 and 304 can therefore implement new capabilities and enhance performance by using, for example, hardware acceleration for cryptography or video processing.

The turret node 302 may be configured with a plurality of SIMS 308 to interface with one or more external systems. The SIMS 308 may be similar to the SIMS 108 of FIGS. 1 and 2, for example. The SIMS 308 may communicate with other systems 1-3 via, for example and without limitation, through Gigabit Ethernet 312, video 314, LVDS 316, RF Baseband 318, or the like.

In FIG. 3, certain capabilities such those associated with Transcode and Register-Transfer Level systems may be imparted to SIMS 308. SIMS 310 and 320 may similarly interface with each other through the slipring 306. The SIMS 322 may interface with one or more systems A-C over Ethernet 324, TTL or ECL logic-based communication 326, serial-based communication 328, or the like. Certain capabilities such as those associated with systems A-C may be imparted in or migrated to SIMS 322.

The slipring 306 may be used across a wide variety of present and future vehicular platforms. While each platform may have distinct hull and turret system components, the hardware of the slipring 306 may be similar or identical across platforms.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Embodiments of the present disclosure, for example, are described above with reference to block diagrams and/or operational illustrations of methods, systems, and computer program products according to embodiments of the present disclosure. The functions/acts noted in the blocks may occur out of the order as shown in any flowchart. For example, two blocks shown in succession may in fact be executed substantially concurrent or the blocks may sometimes be executed in the reverse order, depending upon the functionality/acts involved. Additionally, or alternatively, not all of the blocks shown in any flowchart need to be performed and/or executed. For example, if a given flowchart has five blocks containing functions/acts, it may be the case that only three of the five blocks are performed and/or executed. In this example, any of the three of the five blocks may be performed and/or executed.

A statement that a value exceeds (or is more than) a first threshold value is equivalent to a statement that the value meets or exceeds a second threshold value that is slightly greater than the first threshold value, e.g., the second threshold value being one value higher than the first threshold value in the resolution of a relevant system. A statement that a value is less than (or is within) a first threshold value is equivalent to a statement that the value is less than or equal to a second threshold value that is slightly lower than the first threshold value, e.g., the second threshold value being one value lower than the first threshold value in the resolution of the relevant system.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

What is claimed is:

1. A reconfigurable interconnection node comprising:
  a circuit board including:
    a processing unit executing instructions stored on memory to provide operating system software,
    at least one bus,
    at least one bus connector; and
  at least one system interface module operably connected to the circuit board via the at least one bus, wherein the system interface module is configured to communicate with or exchange data with at least a first external system, and includes:
    a processor card programmed with one or more firmwares, and
    at least one mezzanine module to connect the system interface module with at least the first external system, wherein the operating system software reconfigures the system interface module so that the at least one mezzanine module can communicate with or exchange data with a second external system.

2. The interconnection node of claim 1 wherein the reconfigurable interconnection node includes a plurality of system interface modules, and each of the plurality of system interface modules communicate with each other via the at least one bus.

3. The interconnection node of claim 1 further comprising firmware associated with the at least one system interface module.

4. The interconnection node of claim 1 wherein the processor card includes one or more reconfigurable hardware devices.

5. The interconnection node of claim 1 wherein the at least one mezzanine module includes one or more external electrical interfaces or optical interfaces.

6. The interconnection node of claim 1 wherein the processor card is programmed to:
  receive data from a first interface of the at least one mezzanine module regarding the first external system,
  process the received data regarding the first external network, and
  transmit the processed data to a second interface of the system mezzanine module.

7. The interconnection node of claim 6, wherein the first interface is distinct from the second interface.

8. The interconnection node of claim 1, wherein the at least one mezzanine module communicates with the first external system via a first interface specification, and communicates with a second external system via a second interface specification.

9. The interconnection node of claim 1 wherein the reconfiguration involves changes to only firmware associated with the system interface module.

10. The interconnection node of claim 9 wherein the at least one mezzanine module is associated with at least one IP block in the firmware of the processor card.

11. The interconnection node of claim 1 wherein the at least one mezzanine module includes digital interface circuitry including one or more of buffers, logic-level converters, digital voltage converters, single-ended-to-differential converters, repeaters, digital signal conditioning circuitry, data converters, or impedance matching circuitry, wherein the digital interface circuitry is reconfigurable in situ and without requiring physical hardware modification.

12. The interconnection node of claim 1 wherein the first external system is configured to execute one or more software modules that execute a first instruction set to provide a first capability.

13. The interconnection node of claim 12 wherein the system interface module is configured to execute a second instruction set to implement the first capability without requiring a physical change to the system interface module.

14. The interconnection node of claim 1 wherein the node is configured as a turret node or a hull node.

15. The interconnection node of claim 14 wherein the node is configured to be operably connected with a slipring to connect to the first external system.

16. The interconnection node of claim 1 wherein at least a first software application executes on the processing unit of the circuit board and:
  receives data from at least a first system interface module,
  receives data from a second system interface module,
  performs computations on the received data to generate computational results; and
  transmits the computational results to at least a third system interface module.

17. The interconnection node of claim 16 wherein at least the third system interface module is a network interface.

18. The interconnection node of claim 16 wherein the third system interface module conveys the computational results to at least a second interconnection node.

19. The interconnection node of claim 18 wherein at least a second software application executes on a second processing unit of a second circuit board of the second interconnection node and:
  receives the computational results from the first interconnection node,
  receives data from at least one system interface module of the second interconnection node,
  performs local computations on the received data to generate local computational results, and
  transmits the local computational results to at least one second system interface module of the second interconnection node.

20. The second interconnection node of claim 19 wherein the local computational results comprise a firing solution.

21. The second interconnection node of claim 19 wherein the local computations comprise single- or multi-view image processing results.

* * * * *